United States Patent [19]

Carver et al.

[11] 4,431,708

[45] Feb. 14, 1984

[54] ANNEALED CVD MOLYBDENUM THIN FILM SURFACE

[75] Inventors: Gary E. Carver; Bernhard O. Seraphin, both of Tucson, Ariz.

[73] Assignee: The United States of America as represented by the United States Department of Energy, Washington, D.C.

[21] Appl. No.: 105,338

[22] Filed: Dec. 19, 1979

[51] Int. Cl.$^3$ .................. B32B 15/00; C23C 11/00
[52] U.S. Cl. ......................... 428/641; 427/160; 427/162; 427/163; 427/229; 427/252; 427/255; 427/405; 427/419.7; 428/432; 428/450; 428/627; 428/663; 350/1.7
[58] Field of Search .............. 427/160, 162, 163, 124, 427/229, 248.1, 250, 252, 255, 255.7, 383.3, 383.5, 383.7, 419.7, 404, 405, 383.9; 428/432, 433, 446, 450, 457, 623, 627, 641, 663; 350/1.6, 1.7, 145, 146, 288, 148, 201; 148/6.3

[56] References Cited

U.S. PATENT DOCUMENTS

| | | | |
|---|---|---|---|
| 2,683,305 | 7/1954 | Goetzel | 427/419.7 |
| 2,920,006 | 1/1960 | Yntema et al. | 148/6.3 |
| 3,188,230 | 6/1965 | Bakish et al. | 427/252 |
| 3,282,243 | 11/1966 | Phillips et al. | 427/252 |
| 3,856,582 | 12/1974 | Smeggil et al. | 75/0.5 BA |

FOREIGN PATENT DOCUMENTS

1529441 10/1978 United Kingdom .............. 427/252

449114 12/1974 U.S.S.R. .............................. 427/252

OTHER PUBLICATIONS

Carver et al., "Passivating CVD Molybdenum Films Against Infrared Reflection Losses Caused by Oxidation", Journal of Electrochem. Soc. vol. 125, pp. 1138–1140, 1978.

Oikawa, "Electrical Resistivity of Vacuum-Deposited Molybdenum Films", Journal of Vacuum Sci. Tech. 15(3), May/Jun. 1978, pp. 1117–1121.

Ferguson et al., "Decomposition of Molybdenum Hexacarbonyl", Native, vol. 202, pp. 1327–1328, 1964.

DeRosa et al., "Properties of Molybdenum Films Prepared by Decomposition of the Carbonyl", Journal of Vac. Sci. Tech. vol. 11, No. 1, Jan./Feb., 1974, pp. 455–457.

*Primary Examiner*—S. L. Childs
*Attorney, Agent, or Firm*—Armand McMillan; Albert Sopp; Richard G. Besha

[57] ABSTRACT

Molybdenum thin films deposited by pyrolytic decomposition of $Mo(CO)_6$ attain, after anneal in a reducing atmosphere at temperatures greater than 700° C., infrared reflectance values greater than reflectance of supersmooth bulk molybdenum. Black molybdenum films deposited under oxidizing conditions and annealed, when covered with an anti-reflecting coating, approach the ideal solar collector characteristic of visible light absorber and infrared energy reflector.

9 Claims, 6 Drawing Figures

ANNEALED CVD MOLYBDENUM THIN FILM SURFACE

STATEMENT OF GOVERNMENT INTEREST

U.S. Government has rights in this invention pursuant to Contract No. AS 04-76 ET 20247 between the U.S. Government Department of Energy and Arizona State University.

FIELD OF THE INVENTION

The invention described herein relates generally to a method of manufacture of a molybdenum surface and the surface manufactured by this method, and more particularly to a photothermic solar collector or high energy laser reflector capable of sustained operation at high temperatures.

DESCRIPTION OF PRIOR ART

The maximization of the absorption on and the thermal conversion of photons at a solar receiver surface is crucial for the development of cost effective solar applications. Generally, the thermal efficiency of a solar receiver is a function of the incident energy absorbed minus losses from radiation, conduction and convection. For solar receivers designed to operate at high temperatures (over 500° C.) under forepump vacuum, such as those used with parabolic mirrors or other solar concentrators, thermal radiation losses dominate conduction and convection losses. These solar receivers are optimized by a selective surface having high solar absorptance and low thermal emittance. Researchers have recognized that to have this desirable characteristic a surface must exhibit maximum absorptance of visible solar energy having a wavelength up to approximately 1 micron, and maximum reflectance (minimum emission) of infrared solar energy having a wavelength longer than approximately 1 micron.

The search for a single material with the desired optical properties indicated above has not produced an entirely satisfactory solution for 500° C. operation. Accordingly, much research has been directed toward the use of two materials in tandem; an upper layer absorber of visible light which passes infrared energy and a lower layer reflector of infrared energy. In one arrangement, this structure has been realized by changing the chemical or morphological habitat of a metal surface such that the initial infrared reflectance of the metal is preserved while chemical composition or texture of the metal surface provides the necessary solar absorptance. Most metal oxides are suitable selective absorbers, with the optical action of the thin absorber layer resulting from effects due to intrinsic semiconductor absorption, interference, graded profile of the refractive index, and surface texture. Unfortunately, these surfaces tend to have low thermal collection efficiencies at high temperatures.

Black chromium has proved to be a promising coating for low and intermediate temperature applications. It consists of a variable composition of metallic chromium particles embedded into $Cr_2O_3$ electrolytically deposited onto a nickel-coated steel substrate. Chromium oxides on nickel and nickel-blacks on aluminum have given similar results. However, the solar properties of these coatings begin to deteriorate severely at temperatures between 300° and 400° C.

The use of a known semiconductor manufacturing process, chemical vapor deposition (CVD), for the manufacture of solar collectors was reported by B. Seraphin in *Thin Solid Films*, 39 (1976) p. 87. In a CVD process, the substrate to be coated is placed in the hot zone of a furnace and exposed to a gas mixture containing a gaseous compound of the material to be deposited. This compound breaks up through the transfer of thermal energy at the surface of the hot substrate, leaving behind the desired fraction of the molecule. If the process is repeated through different reaction zones under appropriate conditions, a sequence of successive layers can be deposited and multilayer stack will result. Tubular substrates such as pipes, a favorite geometry for solar collectors, can easily be plated by CVD.

Since silicon is a good absorber of visible light and silver an excellent reflector of infrared energy, a solar collector was made on a stainless steel substrate by evaporation of a layer of silver and a stabilizing layer of $Cr_2O_3$ to prevent temperature-stimulated agglomeration of the silver (with a resultant loss of reflectance), and by CVD of a layer of absorbing silicon and an anti-reflecting coating of $Si_3N_4$. This collector showed excellent properties at temperatures ranging from 20° to 500° C. However, silver is a difficult metal to deposit by CVD. In addition, the manufacturing technique would be significantly simplified if the need for stabilization of the reflector could be eliminated.

The noble metals; i.e., gold, silver and copper, make efficient reflectors at low temperatures but agglomerate unless additional steps such as those noted above are taken. Also, since the visible reflectance of silver is not desirable due to the incomplete absorptance of silicon, a stack of these materials does not work as well as desired above. Accordingly, an effort was made to apply more stable refractory metals such as tungsten and molybdenum to the CVD process, as these metals have high infrared but only moderate visible reflectance. Bulk molybdenum is an excellent, but costly, infrared reflector. Molybdenum films sputtered or evaporated on a substrate exhibit reduced infrared reflectance due to compositional and/or structural modifications. However, as this invention discloses, films manufactured by CVD have a reflectance exceeding that of bulk molybdenum.

The feasibility of producing solar collectors using passivated CVD molybdenum films was reported by G. Carver, B, Seraphin and H. Gurev in the *Journal of the Electrochemical Society*, 125 (1978), p. 1138. Molybdenum carbonyl, $(Mo(CO)_6$, was processed at temperatures ranging from 200° to 350° C. on a substrate of fused silica, passivated with one or more of several elements and annealed in air at 500° C. for up to three hours. The authors reported thin layers of $Al_2O_3$ or $Si_3N_4$ passivate CVD films of molybdenum without degrading their infrared reflectance against exposure to air at 500° C., although the reflectance of films without the passivating layer deteriorated rapidly. They also noted that in some cases reflectance values increased slightly after the first anneal, indicating a possible outgassing and/or structural improvement of the film caused by heating. Although not reported, the total reflectance of the CVD film was about 85% of 10 micron radiation; the reflectance of bulk molybdenum being about 98% of this radiation.

Studies concerning molybdenum have been extensively reported. I. Ferguson and J. Ainscough noted in *Nature* 202 (1964), p. 1327, that $Mo(CO)_6$ may be pyrolyzed to give a range of oxycarbides. H. Oikawa reported in the *Journal of Vacuum Science Technology*, 15(3), 1978, p. 1117, that the electrical resistivity of molybdenum films, evaporated from bulk molybdenum under high vacuum by an electron-beam gun onto $SiO_2$ films on silicon wafers, decreased as the grain size increased after the films were annealed in flowing nitrogen for 15 minutes at temperatures between 700° and 1000° C. In addition, A. DeRosa, D. Dove and R. Loehman reported in the *Journal of Vacuum Science Technology*, 11(1), 1974, p. 455, that X-ray diffraction of molybdenum CVD films after anneal indicated the presence of Mo and $Mo_2C$ in about 2:1 ratio. However, since these reports concerned the electrical properties of molybdenum films used on electrodes, they contain no discussion of the optical properties of this material.

STATEMENT OF THE OBJECTS

It is an object of this invention to provide a process for manufacturing molybdenum thin films which may be used either as the infrared reflecting component of a photothermic converter or as a complete converter exhibiting both solar absorptance and infrared reflectance.

It is also an object of this invention to provide a process for manufacturing solar selective surfaces which may be used at high temperatures.

It is a further object of this invention to provide a process for manufacturing a solar selective surface relatively easily and inexpensively.

It is another object of this invention to provide a highly reflective surface suitable for use as a high energy laser reflector.

It is another object of this invention to provide solar selective surfaces containing molybdenum thin films having the infrared reflectance of bulk molybdenum at a fraction of the cost of the bulk metal.

Other objects, advantages and novel features of the invention will become apparent to those skilled in the art upon examination of the following detailed description of a preferred embodiment of the invention and the accompanying drawings.

SUMMARY OF THE INVENTION

The invention is a process for manufacture of a surface and the surface manufactured by the process. The process includes the chemical vapor deposition of a thin film of molybdenum on a substrate and the subsequent annealing of the film in an atmosphere substantially devoid of oxygen. Depending on the flow of oxygen during CVD the film is either molybdenum or black molybdenum. A solar collector using the molybdenum film is completed by CVD of a silicon absorber and CVD of an anti-reflecting layer. A solar collector using the black molybdenum film is completed by CVD of a passivating anti-reflecting layer.

DETAILED DESCRIPTION OF THE INVENTION

Figure 1:
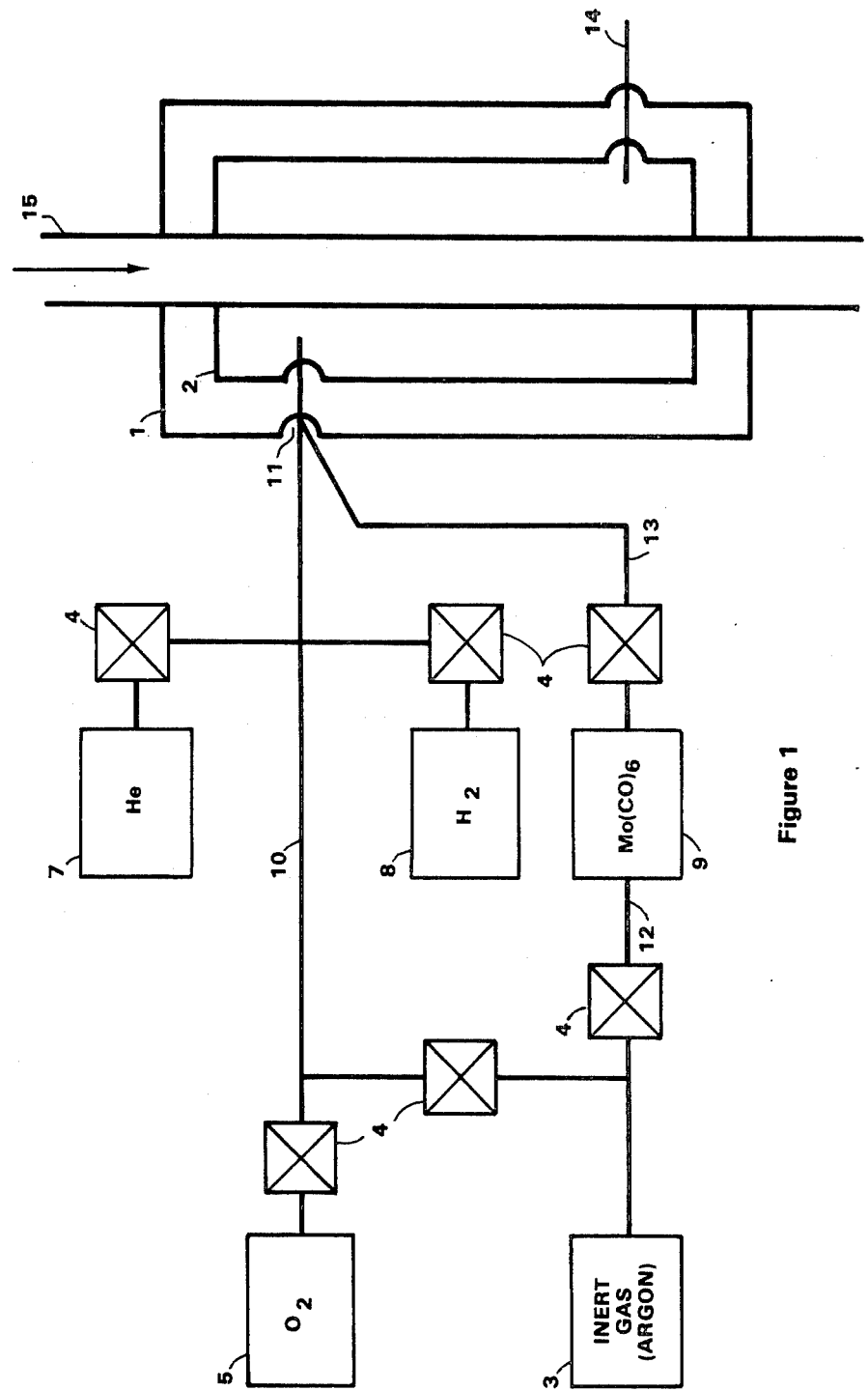
FIG. 1 shows a schematic of CVD apparatus which may be used in the practice of this invention.

In accordance with a preferred embodiment of this invention, thin films of molybdenum are deposited on a substrate as a result of the pyrolytic decomposition of molybdenum carbonyl in a horizontally fed, radiatively heated reactor which is schematically shown in FIG. 1. The reactor includes a heated chamber 1 surrounding an inner deposition chamber 2. A plurality of gases are each connected through a valve and flowmeter 4 to conduit 10 leading to input 11 of heating chamber 1 and deposition chamber 2. These gases include an inert carrier gas 3 such as argon or helium, a supply of oxygen 5 for the manufacture of black molybdenum, a supply of an inert gas 7 such as helium and a reactive gas 8 such as hydrogen for the annealing process, and a source 9 of $Mo(CO)_6$. Since the carbonyl is a powder at room temperature with sublimes to a sufficient degree when elevated to a temperature of 70° C., container 9 and conduit 13 are provided with heating devices such as resistive tapes to keep the $Mo(CO)_6$ in a gaseous state until it enters heating chamber 1. A flow of inert gas 3 through conduit 12 provides transport for the carbonyl. Heating chamber 1 is provided with conventional heating sources such as high intensity lamps or induction heaters. Gases exhaust from chamber 2 through conduit 14. The substrate is carried through chamber 2 on horizontal feed 15. Since this process is carried out at whatever may be the atmospheric pressure, high vacuum seals are not needed where the feed enters the chamber, as long as a suitable device such as an inert gas curtain or other low pressure seal is provided to control the oxygen content of the atmosphere in the chamber.

The primary reaction of the decomposition of molybdenum carbonyl, $Mo(CO)_6 \rightarrow Mo + 6CO \uparrow$, does not go to completion at temperatures below 400° C. As a result, carbon and oxygen are included in the pre-annealed film, reducing its infrared reflectance. Fabrication at temperatures above 400° C. is not desirable because the film becomes powdery and does not adhere to the substrate.

Molybdenum film was deposited on a quartz substrate under two conditions; with and without oxygen. When deposited with an argon carrier without oxygen at 300° C., the molybdenum film had a reflectance relative to that of polished aluminum of approximately 85% for infrared energy at a wavelength of 10 um. However, after the film was subjected to a post deposit anneal in a flowing forming gas comprising 90% helium and 10% hydrogen, the optical performance of the film was observed to have been greatly improved. The purpose of the forming gas is to ensure that the annealing process is carried out in an atmosphere substantially devoid of oxygen. Anneals carried out in an atmosphere of a pure inert gas such as helium was successful with oxygen held to less than 0.1 ppm. The addition of about 10% hydrogen to the inert annealing atmosphere allowed some oxygen to be present without degrading the results.

For high temperature applications, the annealed Mo film must be covered with a passivating layer of sealing material to prevent oxidation which significantly degrades the optical performance of the film. This passivating layer is conveniently applied by the CVD of a layer of $Si_3N_4$ or other suitable material immediately after the film is annealed.

Figure 2:
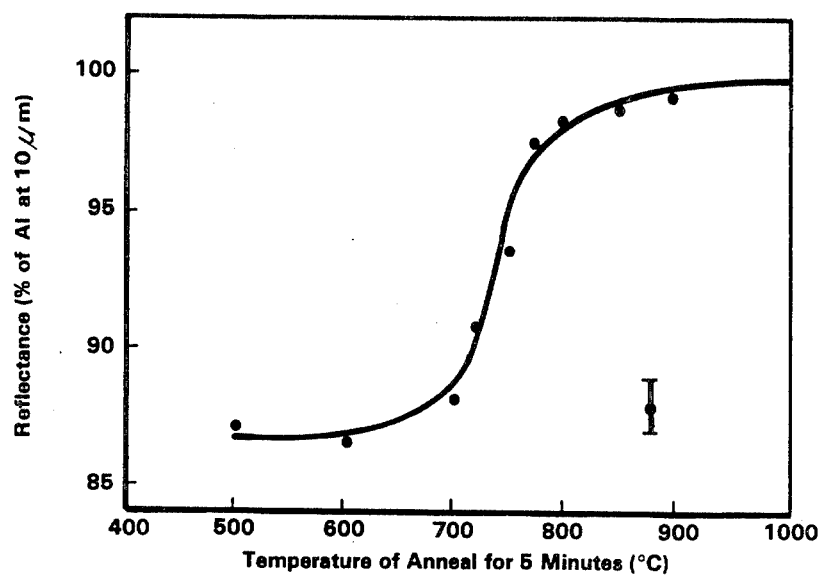
FIGS. 2 and 3 are graphs showing improvements in reflectance of molybdenum films in accordance with the teachings of the invention.
Figure 3:
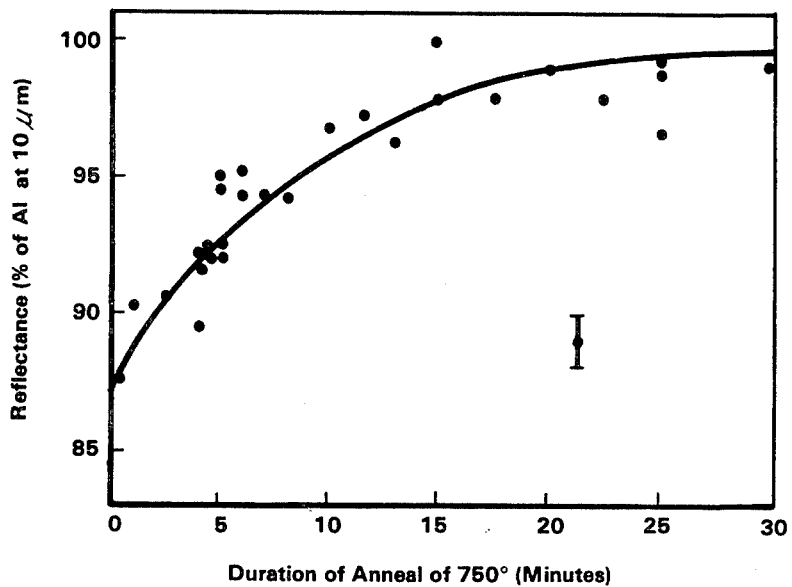

FIG. 2 shows the reflectance of a plurality of samples annealed for 5 minutes at different temperatures. The figure clearly shows that after anneals at temperatures greater than approximately 750° C., the reflectance of the samples improves dramatically. FIG. 3 shows the improvement in reflectance of a similar set of films as a function of anneal duration at 750° C. Similar profiles have been obtained for films deposited at temperatures from 150° C. to 450° C., showing that the reflectance of the annealed film is relatively independent of the temperature of deposition. These figures show that anneals in an atmosphere devoid of oxygen of from 5 minutes at 1000° C. to 30 minutes at 750° C. are capable of producing films which approach the infrared reflectance of the aluminum reference. The scatter of data points shown in FIG. 3 are believed to be caused by variation in thickness of the film from 120 to 300 nm.

Figure 4:
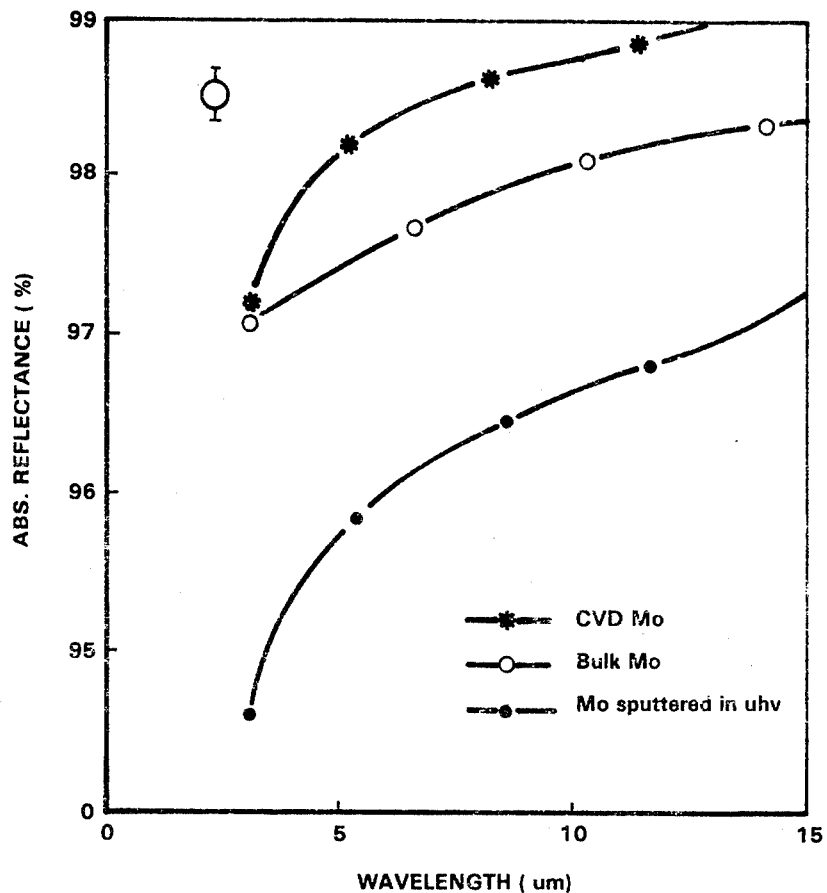
FIGS. 4 and 5 are graphs showing characteristics of molybdenum in accordance with the teachings of the invention.

FIG. 4 shows absolute reflectance values of highly polished bulk molybdenum, a CVD molybdenum film annealed at 1000° C. for 15 minutes and a conventional molybdenum reflective film sputtered on a substrate in an ultra-high vacuum. It is noted that the CVD film is more reflective than both the expensive bulk material and the sputtered sample which required a lengthy and careful predeposition preparation. It is believed that polishing the bulk molybdenum causes a polish-induced surface layer which adversely effect its reflectance. This damage layer is not present in the annealed CVD molybdenum film.

For the aforementioned measurements the anneal period begins after a four minute warm-up and excludes a five to ten minute cool-down.

Three changes in film composition and structure appear to occur in coincidence with the enhancement of reflectance. First, the anneals change crystal structure significantly. As deposited, the films show face centered cubic (fcc)—MoOC structure in X-ray diffraction. Upon partial anneal this structure changes to hexagonal close packed (hcp)—Mo$_2$C. Upon complete anneal it becomes body centered cubic (bcc)—Mo. The abrupt reflectance increase occurs coincidence with the disappearance of the MoOC structure.

In addition, micrographs taken with electron microscopes reveal that annealed films contain grains which are over 50 times the size of the grains in deposited films.

Figure 5:
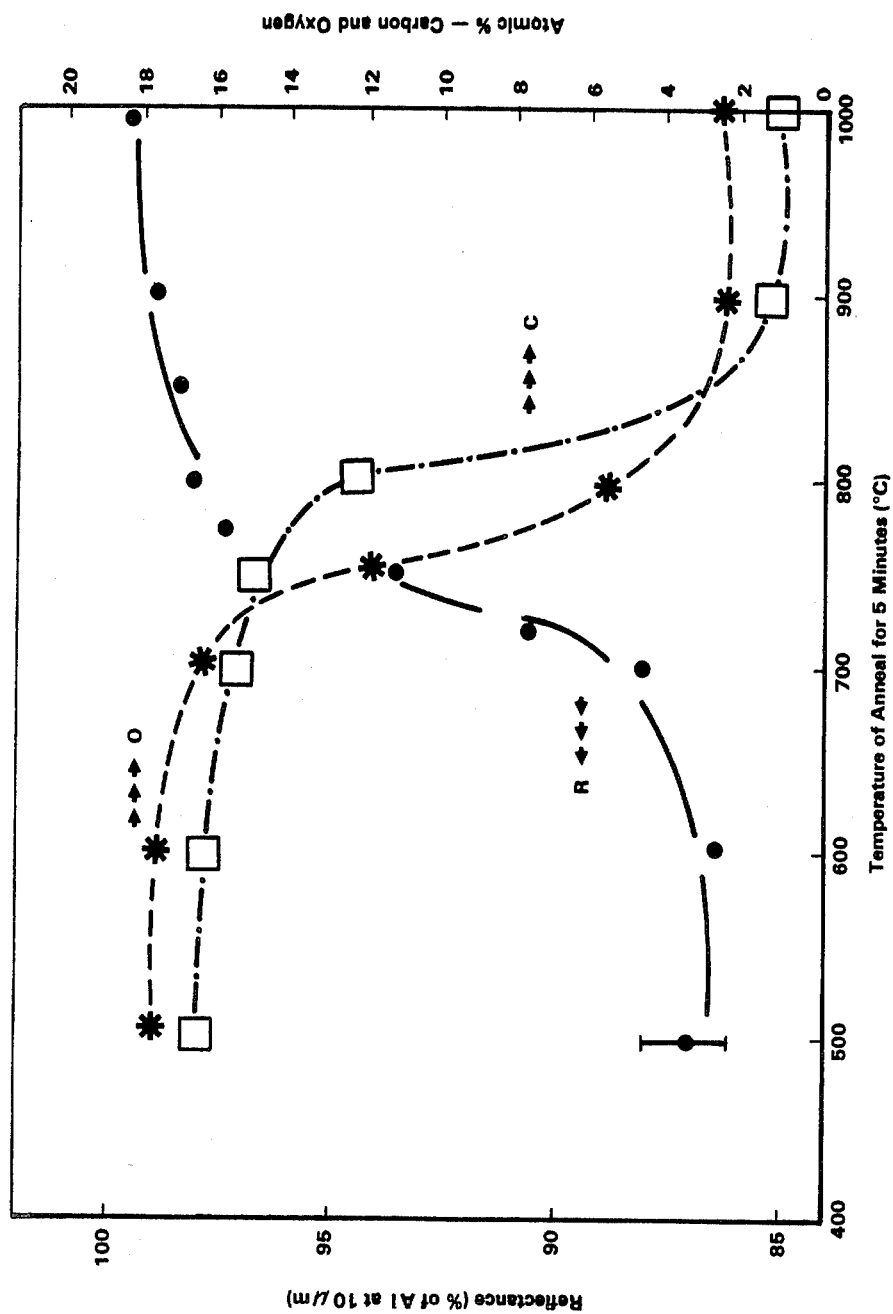

Finally, compositional changes resulting from outgassing during anneal under He and H$_2$ have been measured by several techniques. These determinations are shown in FIG. 5 where the amount of carbon and oxygen in the film reduces significantly while the reflectance of the film increase significantly. Anneals under almost pure helium have produced the same results, indicating that a hydrogen atmosphere is not required for the carbon and hydrogen outgas.

When Mo(CO)$_6$ is held at 70° C. and is deposited in an atmosphere consisting of 99.5% argon and 0.5% (±0.1%) oxygen, the resulting film is known as black molybdenum. This film, when annealed for at least 3 minutes at 700° C., retains the property shown by the previous films of relatively good infrared reflectance, and has the additional property of relatively good solar energy absorbance. When anti-reflected, black molybdenum may be used as a single layer solar collector.

The efficiency of black molybdenum may be seen by reference to the following table showing values of solar absorptance (a) and thermal emittance (e) for a variety of molybdenum films. Each of (a) and (e) are given as a percent of absorptance or emittance relative to Air Mass=2 solar flux and 500° C. black body radiation, respectively. An ideal solar collector has (a)=100 and (e)=0.

|  | (a) | (e) |
| --- | --- | --- |
| Reflective Mo, annealed 20 min, 1000° C. | 37 | 3 |
| As deposited black Mo | 77 | 44 |
| Black Mo, annealed 5 min, 700° C. | 76 | 14 |
| Black Mo, annealed 5 min, 800° C. | 72 | 8 |
| Black Mo, annealed 7 min, 770° C. | 74 | 8 |
| Black Mo, annealed 5 min, 900° C. | 56 | 6 |
| Black Mo, annealed 5 min, 1000° C. | 58 | 6 |
| Anti-reflected black Mo, annealed 5 min, 1000° C. | 82 | 8 |
| Anti-reflected black Mo, annealed 7 min, 770° C. | 91 | 11 |

The anti-reflected black molybdenum was covered by post-anneal CVD of Si$_3$N$_4$ of such thickness that the first order interference fringe minima is optimally located with respect to the solar input, thus maximizing the solar energy absorbed by the film. A layer of Si$_3$N$_4$ approximately 700 A° thick was applied for the measurements in the table.

Tests on black molybdenum film showed it to be deposited with monoclinic MoO$_2$ structure. After being completely annealed for 20 minutes at 1000° C., the black molybdenum film had converted to a bcc-molybdenum film and lost the absorptive characteristic of black molybdenum. However, when only partially annealed in an atmosphere of 90% helium and 10% hydrogen for a shorter time at a lower temperature, the film exhibits a mixture of monoclinic-MoO$_2$ and bcc-Mo structure and retains the characteristics of black molybdenum. A comparison of hemispherical and specular reflectance of this film suggests that surface texturization is not the cause of the blackness. Accordingly, unlike oxidized surfaces and other selective blacks that operate on the basis of their surface texture, the solar absorptance of black molybdenum is not affected significantly by wiping the surface.

Although the molybdenum films reported above were deposited on quartz substrates for test purposes, the CVD process may also be used to manufacture solar collectors and high energy laser reflectors using molybdenum on other suitable substrates such as stainless steel, Inconel, silicon carbide, etc.

Figure 6:
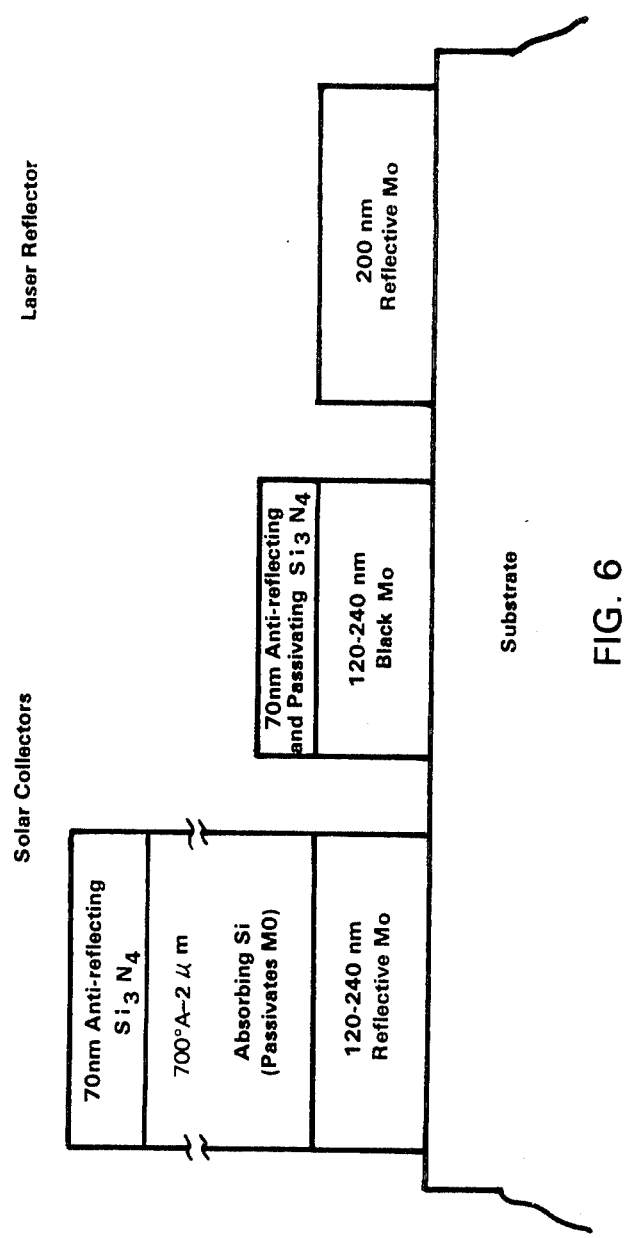
FIG. 6 is a sectional view of the three reflectors made in accordance with the teachings of the invention.

A cutaway view of the three reflectors is shown in FIG. 6. In a typical solar application, the substrate could be stainless steel with a barrier layer of 40 nm of native oxide and 50 to 100 nm of SiO$_2$ to form a stable surface for a 120 to 240 nm layer of Mo. If the Mo layer is black molybdenum, the collector is completed by a 70 nm anti-reflecting and passivating layer of Si$_3$N$_4$. If reflective molybdenum is deposited, a solar collector is made by CVD of a 700 A° to 2 um layer of passivating solar absorbing silicon and the CVD of anti-reflecting Si$_3$N$_4$. A high energy laser reflector could be made by the CVD of 2000 A° of molybdenum on an appropriate substrate such as silicon carbide. Each of these devices can be manufactured by a continuous feed through a series of chemical vapor deposition stations; a different layer being added at each station.

The finished reflective surface is thus easily manufactured with a reflectance nearly as good as the reflectance of noble metals. It operates at temperatures where noble metals are unusable. The invention contemplates the manufacture of either a reflector or, by the simple addition of oxygen to the process, a combination absorber, reflector. The process of manufacture is carried out at atmospheric pressure without the need for expensive and costly vacuum equipment.

The foregoing description of a preferred embodiment of the invention has been presented for purposes of illustration and description and is not intended to be exhaustive or to limit the invention to the precise form disclosed. It was chosen and described in order to best explain the principles of the invention and their practical application to thereby enable others skilled in the art to best utilize the invention in various embodiments and with various modifications as are suited to the particular use contemplated. It is intended that the scope of the invention be defined by the claims appended hereto.

We claim:

1. A process for the manufacture of a highly reflective surface, comprising:
   (a) fabricating on a substrate a thin adherent film by chemical vapor deposition of $Mo(CO)_6$ at about atmospheric pressure of an inert carrier gas, said film showing a face centered cubic-MoOC structure under X-ray diffraction;
   (b) annealing said film in an atmosphere substantially devoid of oxygen at a temperature of at least 700° C. for a duration of at least 3 minutes; and
   (c) fabricating over said annealed film by chemical vapor deposition a layer of solar absorbing silicon.

2. The process of claim 1 wherein said film is fabricated at a temperature greater than 150° C.

3. The process of claim 1 wherein said annealing atmosphere consists of flowing helium.

4. The process of claim 1 where said film is annealed at a temperature greater than 750° C.

5. The process of claim 4 wherein said film is annealed at a temperature of 1000° C. for 15 minutes.

6. The process of claim 1 including passivating said annealed film with a layer of oxidation preventing sealing material before said film oxidizes.

7. The process of claim 1 including fabricating over said silicon by chemical vapor deposition an anti-reflecting layer of $Si_3N_4$.

8. A reflective surface manufactured according to the process of claim 1.

9. A laser reflector manufactured according to the process of claim 1.